(12) United States Patent
Belot et al.

(10) Patent No.: US 8,502,574 B2
(45) Date of Patent: Aug. 6, 2013

(54) DEVICE AND METHOD FOR GENERATING A SIGNAL OF PARAMETRIZABLE FREQUENCY

(75) Inventors: Didier Belot, Rives (FR); Pierre-Olivier Lucas De Peslouan, Bordeaux (FR); Cédric Majek, Talence (FR); Yann Deval, Bordeaux (FR); Thierry Taris, Bordeaux (FR); Jean-Baptiste Begueret, Merignac (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 13/229,478

(22) Filed: Sep. 9, 2011

(65) Prior Publication Data
US 2012/0062288 A1    Mar. 15, 2012

(30) Foreign Application Priority Data
Sep. 14, 2010   (FR) ...................... 10 57335

(51) Int. Cl.
   *H03L 7/06*   (2013.01)
(52) U.S. Cl.
   USPC ........................... 327/156; 327/158; 327/161
(58) Field of Classification Search
   USPC ................ 327/156–157; 331/18–19, 25, 34, 331/373–376
   See application file for complete search history.

(56) References Cited

U.S. PATENT DOCUMENTS

| | | | |
|---|---|---|---|
| 6,157,691 A * | 12/2000 | Wei | 375/376 |
| 6,995,590 B1 | 2/2006 | Pedersen | |
| 7,301,414 B2 * | 11/2007 | Hino | 331/179 |
| 2007/0030079 A1 * | 2/2007 | Kawamoto et al. | 331/16 |
| 2008/0042698 A1 | 2/2008 | Kim | |
| 2011/0169535 A1 * | 7/2011 | Kyles | 327/156 |

OTHER PUBLICATIONS

République Française Institut National De La Propriété Industrielle, Rapport De Recherche Préliminaire (Preliminary Search Report); issued in French Patent Application No. 1057335 on Apr. 6, 2011, 2 pgs.
Wei, G.-Y., et al., "A 500MHz MP/DLL Clock Generator for a 5Gb/s Backplane Transceiver in 0.25μm CMOS," IEEE International Solid-State Circuits Conference, Session 26, Embedded and Digital Systems, Paper 26.4, 2003, 8 pgs.
Bae, Y-C., et al., "A Mixed PLL/DLL Architecture for Low Jitter Clock Generation," ISCAS, IEEE, 2004, pp. IV 788-IV 791.
Gierkink, S.L.J., "Low-Spur, Low-Phase-Noise Clock Multiplier Based on a Combination of PLL and Recirculating DLL With Dual-Pulse Ring Oscillator and Self-Correcting Charge Pump," IEEE Journal of Solid-State Circuits, vol. 43, No. 12, Dec. 2008, pp. 2967-2976.

* cited by examiner

*Primary Examiner* — John Poos
(74) *Attorney, Agent, or Firm* — Slater & Matsil, L.L.P.

(57) ABSTRACT

Device for generating a signal of parametrizable frequency comprising a phase locked loop including a generator of a reference signal, a phase-frequency comparator comprising a first input for receiving the reference signal, an oscillator controlled on the basis of the result output by the phase-frequency comparator, a fractional divider coupled between an output of the oscillator and a second input of the phase-frequency comparator, and a selector selectively linking an input of the oscillator either with an input of the generator, or with the output of the oscillator as a function of the multiplication ratio of the fractional divider.

22 Claims, 2 Drawing Sheets

DEVICE AND METHOD FOR GENERATING A SIGNAL OF PARAMETRIZABLE FREQUENCY

CROSS-REFERENCE TO RELATED APPLICATION

This application claims the priority benefit of French patent application number 1057335, filed Sep. 14, 2010, entitled "Device and method for generating a signal of parametrizable frequency," which is hereby incorporated by reference to the maximum extent allowable by law.

TECHNICAL FIELD

The invention relates to the generation of signals of parametrizable frequency.

BACKGROUND

Currently, frequency synthesizers are used to generate signals of variable frequencies on the basis of two types of architecture, a phase locked loop, denoted PLL, and a delay locked loop, denoted DLL.

It is possible to cite for example the publication "A Mixed PLL/DLL Architecture for low jitter clock generation (2004 IEEE, Authors: Yong-Cheol Bae and Gu-Yeon Wei, published on 23-26 May 2004)" which discloses a system for decreasing the temporal drift of a signal using an architecture of PLL type and of DLL type. The system comprises an integer divider for generating frequencies of the output signal a multiple of the clock frequency, but it does not make it possible to generate sufficiently accurate frequencies. Furthermore, it uses a second-order loop filter, thereby rendering the system slow in respect of the generation of the output signal.

It is also possible to cite the publication "Low-Spur, Low-Phase-Noise Clock Multiplier Based on a Combination of PLL and Recirculating DLL With Dual-Pulse Ring Oscillator and Self-Correcting Charge Pump (2008 IEEE, Author: Sander L. J. Gierkink, published on 10 Dec. 2008)" which discloses a system for synthesizing signals of frequency a multiple of a clock frequency having low phase noise comprising a combination of a PLL and of a DLL. But neither does this document describe a means for obtaining still more accurate frequencies. Moreover, in this system, the oscillator of the DLL is activated permanently by the edges of the clock signal, this having a tendency to slow down the generation of the output signal.

There is therefore proposed a device and a method for generating signals having a sufficiently accurate frequency while being stable. There is also proposed a device and a method which are fast.

SUMMARY OF THE INVENTION

According to one aspect, there is proposed a device for generating a signal of parametrizable frequency comprising a phase locked loop including a generator of a reference signal, a phase-frequency comparator comprising a first input for receiving the reference signal, and an oscillator controlled on the basis of the result output by the phase-frequency comparator.

This device comprises a fractional divider coupled between an output of the oscillator and a second input of the phase-frequency comparator, a selector selectively linking an input of the oscillator either with an output of the generator, or with the output of the oscillator as a function of the multiplication ratio of the fractional divider.

According to another aspect, there is proposed a method for generating a signal of parametrizable frequency comprising a phase locked loop including a generator of a reference signal, a phase-frequency comparator comprising a first input for receiving the reference signal, and an oscillator controlled on the basis of the result output by the phase-frequency comparator.

In this method, the said phase locked loop comprising a fractional divider coupled between an output of the oscillator and a second input of the phase-frequency comparator, an input of the oscillator is selectively linked either with an output of the generator, or with the output of the oscillator as a function of the multiplication ratio of the fractional divider.

BRIEF DESCRIPTION OF THE DRAWINGS

Other advantages and characteristics of the invention will be apparent on examining the detailed description of a few examples of wholly non-limiting modes of implementation and embodiments, and the appended drawings in which.

DETAILED DESCRIPTION OF ILLUSTRATIVE EMBODIMENTS

Figure 1:
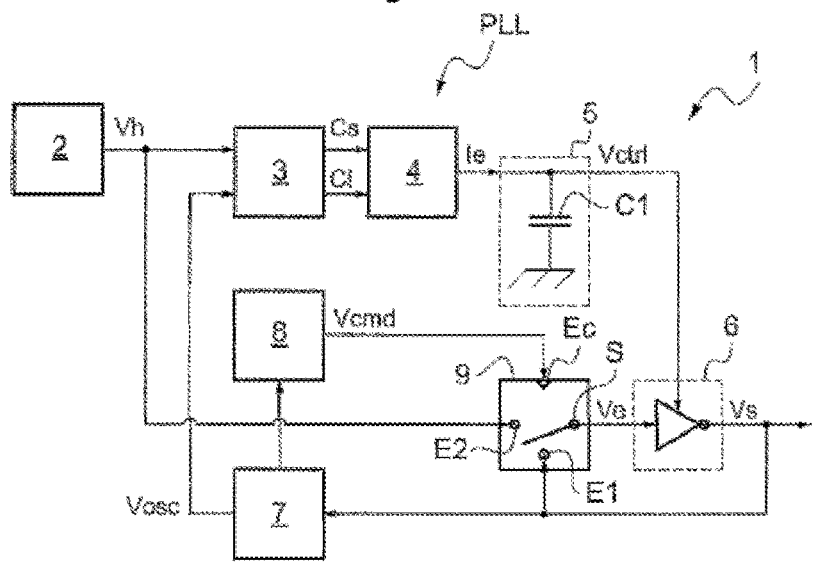
FIG. 1 illustrates in a schematic manner an embodiment of a device for generating a signal of parametrizable frequency.

Before describing the illustrated embodiments specifically, various embodiments and advantageous features will be generally described. According to one aspect, there is proposed a device for generating a signal of parametrizable frequency comprising a phase locked loop including a generator of a reference signal, a phase-frequency comparator comprising a first input for receiving the reference signal, and an oscillator controlled on the basis of the result output by the phase-frequency comparator.

This device comprises a fractional divider coupled between an output of the oscillator and a second input of the phase-frequency comparator, a selector selectively linking an input of the oscillator either with an output of the generator, or with the output of the oscillator as a function of the multiplication ratio of the fractional divider.

Thus, a means for generating more accurate frequencies than those proposed in the prior art is provided. The fact of controlling the oscillation of the oscillator so as to relaunch the latter by the reference signal periodically, that is to say to maintain the oscillation at the output of the oscillator, makes it possible to render the device particularly stable.

The phase locked loop can comprise a filter of the low-pass type coupled between the output of the phase-frequency comparator and a control input of the oscillator. According to one embodiment, the filter of the low-pass type is a first-order filter. Furthermore, the use of a PLL having a first-order filter renders the device faster with respect to a PLL having a higher-order filter, while being stable.

Advantageously, the multiplication ratio of the fractional divider is parametrizable. According to one embodiment, the multiplication ratio is equal to a ratio between a dividend and a divisor and the selector periodically links the oscillator with the generator according to a drive period equal to a multiple of the divisor of the said division ratio multiplied by the period of the reference signal.

Thus, the oscillation of the oscillator is activated by the reference signal at each instant where the reference signal is synchronized with the output signal of the oscillator, thereby making it possible to stabilize the device. Indeed, this periodic driving of the oscillator makes it possible to eliminate the oscillations of the oscillator control signal, the consequence of which is to prevent the frequency drift of the output signal of the oscillator.

According to another embodiment, the selector is a breaker.

According to another aspect, there is proposed a method for generating a signal of parametrizable frequency comprising a phase locked loop including a generator of a reference signal, a phase-frequency comparator comprising a first input for receiving the reference signal, and an oscillator controlled on the basis of the result output by the phase-frequency comparator.

In this method, the said phase locked loop comprising a fractional divider coupled between an output of the oscillator and a second input of the phase-frequency comparator, an input of the oscillator is selectively linked either with an output of the generator, or with the output of the oscillator as a function of the multiplication ratio of the fractional divider.

According to one mode of implementation the oscillator is controlled on the basis of a control signal formulated by a filter of the low-pass type coupled between the output of the phase-frequency comparator and a control input of the oscillator.

According to another mode of implementation, the multiplication ratio is equal to a ratio between a dividend and a divisor and the oscillator is periodically linked with the generator according to a drive period equal to a multiple of the divisor of the said division ratio multiplied by the period of the reference signal.

In FIG. 1 has been represented an embodiment of a device 1 for generating a signal Vs of parametrizable frequency fs. This device 1 comprises a phase locked loop PLL for formulating the said signal Vs. This phase locked loop PLL comprises a generator 2, a phase-frequency comparator 3, a charge pump 4, a filter 5 of the low-pass type, also referred to herein as a low-pass filter, and an oscillator 6. The device 1 furthermore comprises a fractional divider 7, a drive means 8 and a selector 9.

The generator 2 generates a reference signal Vh, having a reference frequency f0, on a first input of the phase-frequency comparator 3. This generator may be a quartz oscillator for generating the reference signal Vh, also denoted by clock signal. The phase-frequency comparator 3 comprises a second input for receiving a signal Vosc emitted by the fractional divider 7. The phase-frequency comparator compares phase-wise and frequency-wise the two signals Vh,Vosc received respectively on its two inputs and generates two signals Cs,Ci directed towards the charge pump 4. These two signals Cs,Ci emitted by the phase-frequency comparator 3 correspond to the result of the comparison of the input signals Vh,Vosc of the comparator 3. If the phase of the reference signal Vh leads with respect to that of the signal Vosc, the first signal generated Cs is zero, and conversely, if the phase of the reference signal Vh lags with respect to that of the signal Vosc, the second signal generated Ci is zero.

The charge pump 4 receives the two signals Cs,Ci generated by the said comparator 3 and formulates an error current Ie as a function of the result of the comparison of the input signals Vh,Vosc of the comparator 3. This error current Ie is transmitted to the filter 5, also denoted by loop filter, which formulates a control voltage Vctrl as a function of the error current Ie received. This loop filter 5 is a filter of the low-pass type, which may be a first-order or higher-order filter. For example, the loop filter 5 is a first-order filter embodied on the basis of a capacitor C1 coupled between the output of the charge pump 4 and earth. The use of a simple capacitor C1 makes it possible to render the device more compact. This control voltage Vctrl is emitted towards the oscillator 6. This oscillator 6 comprises an odd number of controllable delay elements mounted in series, which are for example inverters, controlled by the control voltage Vctrl. The advantage of this type of oscillator is that it permits a broad operating frequency band. The oscillator 6 comprises a control input for receiving the said control voltage Vctrl and a main input coupled to an input of the first delay element. This oscillator 6 formulates, on an output coupled to the last delay element, the signal Vs of parametrizable frequency.

The output signal Vs from the oscillator 6 is also transmitted towards the fractional divider 7 and the selector 9.

The fractional divider makes it possible to divide the frequency of the output signal Vs from the oscillator by a factor RM, also denoted by multiplication ratio, so that the frequency fosc of the output signal Vosc from the divider is given by the following equation 1:

$$fosc = fs/RM \quad \text{(equation 1)}$$

where fosc: frequency of the signal Vosc formulated by the fractional divider 7;

fs: frequency of the output signal Vs from the oscillator 6; and

RM: multiplication ratio of the fractional divider.

The multiplication ratio RM is a decimal number, thereby making it possible to obtain an accurate frequency fs of the output signal Vs from the oscillator 6. Furthermore, this multiplication ratio is parametrizable as a function of the value of the frequency fs desired.

Stated otherwise, at an instant t, the multiplication ratio RM is either equal to an integer number N, or equal to an integer number N+1, where N is an integer number such that N<RM<N+1. The following equation 2 is then satisfied at the instant t:

$$fosc = fs/N \text{ or } fosc = fs/(N+1) \quad \text{(equation 2)}$$

where N<RM<N+1.

Moreover, the multiplication ratio RM may be expressed according to the ratio between a dividend DD and a divisor DV. Equation 1, fosc=fs/RM, is therefore satisfied on average over a sufficiently long time, that is to say a time greater than the ratio DV/f0 where f0 is the frequency of the reference signal Vh.

The drive means 8 receives the value of the multiplication ratio RM from the fractional divider 7, and drives the selector on the basis of a drive signal Vcmd formulated as a function of the value of the said multiplication ratio RM.

The selector 9 comprises a first input E1 configured to receive the output signal Vs from the oscillator 6, a second input E2 configured to receive the reference signal Vh emitted by the generator 2, and a drive input Ec to receive the drive signal Vcmd arising from the drive means 8. Moreover, the selector 9 comprises an output S coupled to the main input of the oscillator 6. This output S of the selector is furthermore configured to emit an input signal Ve on the main input of the oscillator 6. This input signal Ve represents either the output signal Vs from the oscillator 6, or the reference signal Vh, as a function of the drive signal Vcmd.

According to the value of the drive signal Vcmd, the selector couples either the first input E1 with the main input of the oscillator 6, or the second input E2 with the main input of the oscillator 6. This selector 9 may be a breaker; it may be embodied, for example, on the basis of inverters of the same type as the oscillator delay elements, so as to generate the least possible delay in the signal emitted towards the oscillator 6.

When the first input E1 is coupled with the main input of the oscillator 6, the oscillator is said to be closed and the device 1 is said to operate in PLL mode. In this case, the device has the same behavior as a phase locked loop PLL with fractional divider.

When the second input E2 is coupled with the main input of the oscillator 6, the oscillator is said to be open and the device 1 is said to operate in DLL mode. In this case, the device has the same behavior as a delay locked loop DLL. Indeed, in DLL mode, the oscillator oscillates by virtue of the edges of the reference signal Vh; the oscillator is also said to be activated.

This device 1 makes it possible to generate a signal Vs having a frequency fs according to the following equation 2:

$$fs = RM \cdot f0 \quad \text{(equation 2)}$$

where f0 is the frequency of the reference signal Vh.

The device 1 uses the advantages of a delay locked loop DLL in an architecture of PLL phase locked loop type.

The delay locked loop DLL exhibits the advantage of preventing the frequency drift of the signal output by the oscillator 6 by virtue of the periodic activation, according to a chosen period, of the oscillator 6 by the reference signal Vh. Thus, the phase noise for frequencies below the reference frequency f0 is substantially equal to the noise of the reference signal Vh.

When a conventional PLL is used to generate signals of parametrizable frequency, the faster the PLL, the more unstable it is. Indeed, the use of a first-order filter to obtain a fast PLL generates an oscillator control signal which exhibits oscillations around the control voltage, thereby resulting in a signal at the output of the oscillator which drifts in phase; stated otherwise, the PLL is unstable.

In order to stabilize the PLL, the advantages of the DLL are used. The oscillator 6 is therefore relaunched in a periodic manner so as on the one hand to prevent frequency drift of the output signal Vs from the oscillator 6, and on the other hand to avoid phase drift of the signal Vs resulting from the oscillations in the control signal Vctrl.

A device which is both fast and stable is therefore provided.

The periodic activation of the oscillator according to a chosen period Ta is performed by the driving of the selector 9 by the drive means 8. The drive period Ta for the selector 9 is computed as a function of the decimal part of the multiplication ratio RM and of the period T0 of the reference signal Vh. The multiplication ratio RM may be expressed according to the ratio between a dividend DD and a divisor DV. The period Ta will therefore be proportional to a multiple of the divisor DV, that is to say proportional to a multiple of the smallest integer divisor of the multiplication ratio RM. In particular, $Ta = n \cdot DV \cdot T0$, where n is an integer and T0 is the period of the reference signal Vh.

This device 1 has the particular feature of being parametrizable by changing the value of the multiplication ratio RM.

Figure 2:
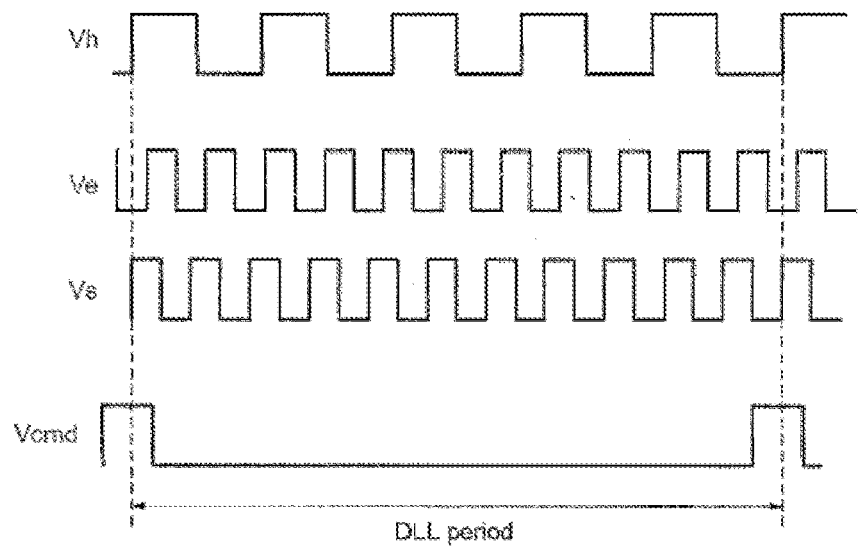
FIG. 2 illustrates in a schematic manner the timecharts of various signals used in the device described in FIG. 1.

In FIG. 2 have been schematically represented the time-charts of the main signals used in the device 1 for generating a signal of parametrizable frequency according to the embodiment described in FIG. 1. The reference signal Vh, the input signal Ve for the oscillator 6, the output signal Vs from the oscillator 6 and the drive signal Vcmd for the selector 9 have been represented.

As the device 1 comprises a fractional divider, that is to say the multiplication ratio RM is a decimal number, the edges of the reference signal Vh are not always synchronized with the edges of the output signal Vs from the oscillator 6. The oscillator 6 is relaunched at the instants where the edges of the reference signal Vh and the edges of the output signal Vs from the oscillator 6 are synchronized. The selector 9 is therefore driven so as to couple the second input E2 of the selector 9 with the main input of the oscillator 6 (DLL mode) and an edge of the reference signal Vh (a rising or falling edge) is allowed to pass through towards the oscillator 6 so as to relaunch the latter. Next, after having allowed through an edge of the reference signal Vh, the selector 9 is driven so as to couple the first input E1 of the selector 9 with the main input of the oscillator 6 (PLL mode). Stated otherwise, the oscillator 6 is activated according to the period $Ta = n \cdot DV \cdot T0$. For example, if it is desired to generate a signal Vs having a frequency $fs = 2.2 \cdot f0$, that is to say RM=11/5, the oscillator 6 is activated periodically according to the period $Ta = 5 \cdot T0$, with n=1.

In this example, the edges of the signals Vh and Vs are synchronized every five clock cycles.

At each period Ta, the oscillator 6 is relaunched and the device is in DLL mode. The remainder of the time, the drive signal Vcmd drives the selector 9 so that the first input E1 is coupled with the main input of the oscillator, the oscillator is then said to be closed and the device is said to operate in PLL mode.

Figure 3:
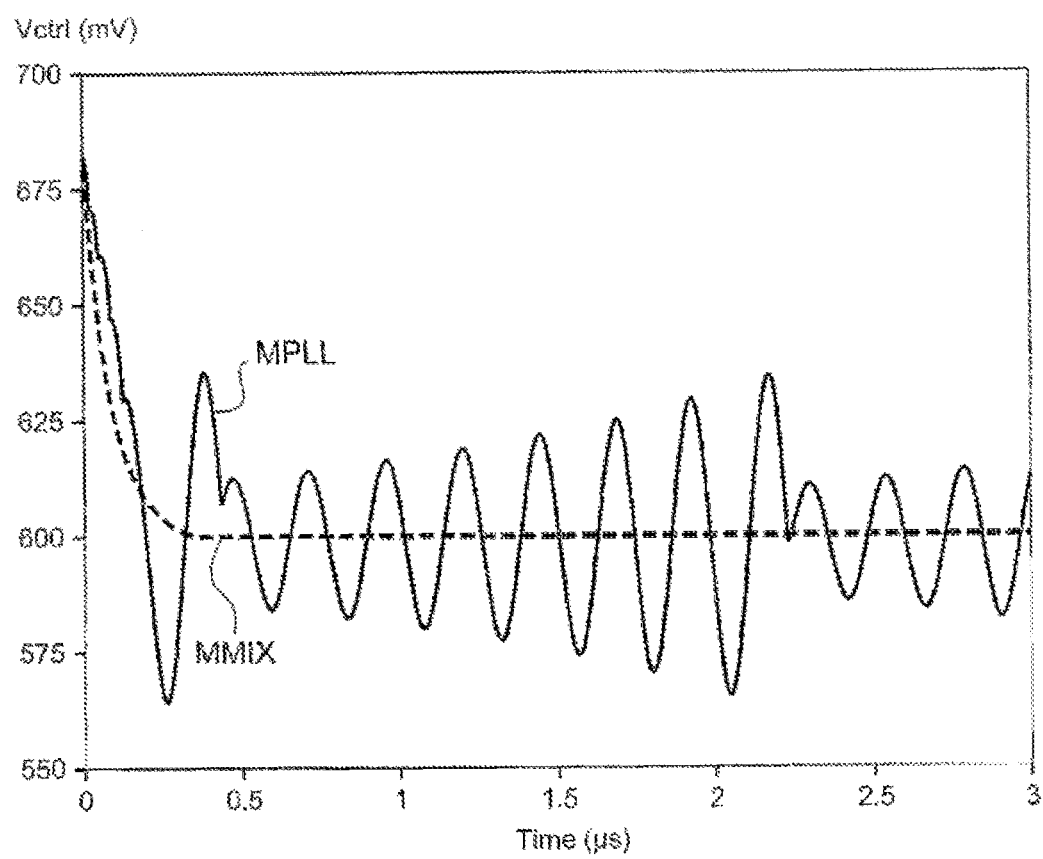
FIG. 3 illustrates in a schematic manner the comparison of a curve of the control signal of an oscillator of a conventional phase locked loop and of a curve of the control signal of an oscillator according to the invention.

Represented in FIG. 3, in a schematic manner, is a comparison of a curve MPLL, solid line, of the control signal of an oscillator of a conventional phase locked loop having a loop filter of the first-order low-pass type and of a curve MMIX, dashed, of the control signal Vctrl of the oscillator 6 according to the invention.

The curve MPLL of a conventional phase locked loop exhibits oscillations around the oscillator control voltage, thereby showing the instability of the conventional PLLs.

Conversely, the curve MMIX exhibits practically no oscillation, so the device 1 is therefore stable. Furthermore, it is noted that these two curves MMIX, MPLL have slopes at the origin which are parallel, thereby showing that the device 1 is fast, stated otherwise that it retains the speediness of the PLL having a first-order filter.

Moreover, a method for generating a signal of parametrizable frequency may be implemented by the device just described.

This method may be implemented in a computer embedded in a wireless communication apparatus, such as a cellular mobile telephone, in software form or also in the form of logic circuits.

The device for generating a frequency signal thus described makes it possible to obtain an accurate frequency signal suited to mobile communication apparatuses. The use of a first-order filter makes it possible to embody a fast frequency synthesizer suited to fast frequency hops. In particular, such a device makes it possible to use a loop filter cutoff frequency greater than a device using a conventional PLL. Thus it is possible to increase the cutoff frequency of the loop filter so as to increase the speed of the device while guaranteeing the stability of the device. Furthermore, the embodying of such a filter on the basis of a simple capacitor makes it possible to reduce the size of the device, thereby making it possible to improve the integration of this device into an integrated electronic circuit and thus reduce the consumption of silicon. Moreover, the parametrizable aspect of the device and its stability apply perfectly to standard synthesizers where the time of temporal response to a change of frequency must be as small as possible.

What is claimed is:

1. A device for generating a signal of parametrizable frequency comprising:
    a phase locked loop including a generator of a reference signal;
    a phase-frequency comparator comprising a first input for receiving the reference signal;
    an oscillator controlled on the basis of a result output by the phase-frequency comparator;
    a fractional divider coupled between an output of the oscillator and a second input of the phase-frequency comparator; and
    a selector comprising an output coupled to an input of the oscillator, a first input coupled to an output of the generator, and a second input coupled to the output of the oscillator, the selector selectively linking the output of the selector either to the first input of the selector or the second input of the selector as a function of a multiplication ratio of the fractional divider.

2. The device according to claim 1, in which the phase locked loop comprises a filter of the low-pass type coupled between an output of the phase-frequency comparator and a control input of the oscillator.

3. The device according to claim 2, in which the filter of the low-pass type is a first-order filter.

4. The device according to claim 1, in which the multiplication ratio of the fractional divider is parametrizable.

5. The device according to claim 1, in which the multiplication ratio is equal to a ratio between a dividend and a divisor and the selector periodically links the oscillator with the generator according to a drive period equal to a multiple of the divisor of said division ratio multiplied by the period of the reference signal.

6. The device according to claim 1, in which the selector is a breaker.

7. The device according to claim 1, wherein the selector is a single pole double throw switch.

8. A method for generating a signal of parametrizable frequency comprising a phase locked loop including a generator of a reference signal, a phase-frequency comparator comprising a first input for receiving the reference signal, and an oscillator controlled on the basis of the result output by the phase-frequency comparator, characterized in that the said phase locked loop comprises a fractional divider coupled between an output of the oscillator and a second input of the phase-frequency comparator, the method comprising:
    selectively linking an input of the oscillator either with an output of the generator or with the output of the oscillator, the selection between the output of the generator and the output of the oscillator being made as a function of a multiplication ratio of the fractional divider.

9. The method according to claim 8, further comprising:
    controlling the oscillator on the basis of a control signal formulated by a filter of the low-pass type coupled between the output of the phase-frequency comparator and a control input of the oscillator.

10. The method according to claim 8, in which the multiplication ratio of the fractional divider is parametrizable.

11. The method according to claim 8, in which the multiplication ratio is equal to a ratio between a dividend and a divisor, and the oscillator is periodically linked with the generator according to a drive period equal to a multiple of the divisor of the said division ratio multiplied by the period of the reference signal.

12. A device comprising:
    means for generating a reference signal;
    means for comparing the reference signal to an oscillator feedback signal and generating an oscillator control signal;
    an oscillator configured to receive the oscillator control signal and to generate a frequency controlled signal;
    means for dividing a frequency of the frequency controlled signal by a multiplication ratio to generate the oscillator feedback signal; and
    means for selectively coupling an input of the oscillator to the reference signal in a first mode and the frequency controlled signal in a second mode, the second mode occurring at a different time than the first mode.

13. The device of claim 12, wherein the oscillator operates in a delay locked loop mode when the reference signal is coupled to the input of the oscillator and operates in a phase locked loop mode when the frequency controlled signal is coupled to the input of the oscillator.

14. The device of claim 12, wherein the means for generating an oscillator control signal comprises a comparator and a low-pass filter.

15. The device of claim 14, wherein the low-pass filter is a first order filter.

16. The device of claim 15, wherein the low-pass filter is a capacitor connected between an output of the comparator and ground.

17. The device of claim 12, wherein the means for selectively coupling comprises a switch.

18. The device of claim 12, wherein the device is configured such that selector selectively couples the reference signal or the frequency controlled signal to an input of the oscillator with a period that is a function of a multiplication ratio of the means for dividing a frequency.

19. The device of claim 18, wherein which the multiplication ratio is equal to a ratio between a dividend and a divisor and the means for selectively coupling couples the oscillator with the means for generating according to a drive period equal to a multiple of the divisor of said division ratio multiplied by the period of the reference signal.

20. The device of claim 12, wherein the oscillator comprises a plurality of controllable delay elements.

21. The device of claim 20, wherein the controllable delay elements comprises inverters.

22. The device of claim 21, wherein the means for selectively coupling comprises an inverter of a same type as the inverters of the controllable delay elements.

* * * * *